US 7,592,648 B2

(12) United States Patent
Böttner et al.

(10) Patent No.: US 7,592,648 B2
(45) Date of Patent: Sep. 22, 2009

(54) INTEGRATED CIRCUIT ARRANGEMENT WITH NPN AND PNP BIPOLAR TRANSISTORS AND CORRESPONDING PRODUCTION METHOD

(75) Inventors: Thomas Böttner, Munich (DE); Stefan Drexl, Moorenweis-Eismerszell (DE); Thomas Huttner, Marktoberdorf (DE); Martin Seck, Munich (DE)

(73) Assignee: Infineon Technologies AG, Munich (DE)

( * ) Notice: Subject to any disclaimer, the term of this patent is extended or adjusted under 35 U.S.C. 154(b) by 254 days.

(21) Appl. No.: 11/295,706

(22) Filed: Dec. 6, 2005

(65) Prior Publication Data

US 2006/0131694 A1    Jun. 22, 2006

Related U.S. Application Data

(63) Continuation of application No. PCT/EP2004/050978, filed on Jun. 1, 2004.

(30) Foreign Application Priority Data

Jun. 21, 2003    (DE)    ................ 103 27 709

(51) Int. Cl.
    *H01L 31/072*    (2006.01)
(52) U.S. Cl. ............... 257/197; 257/511; 257/E29.003; 257/E29.185; 438/235
(58) Field of Classification Search .............. 257/565, 257/197, 511, 525, 557, 575, E29.003, E29.185; 438/235, 309, 312
    See application file for complete search history.

(56) References Cited

U.S. PATENT DOCUMENTS

| | | | |
|---|---|---|---|
| 4,357,622 A | 11/1982 | Magdo et al. | |
| 4,485,552 A | 12/1984 | Magdo et al. | |
| 5,376,822 A | 12/1994 | Taguchi | |
| 5,637,909 A * | 6/1997 | Nakajima et al. | 257/559 |
| 5,930,635 A | 7/1999 | Bashir et al. | |
| 5,953,600 A * | 9/1999 | Gris | 438/200 |
| 6,005,284 A * | 12/1999 | Ejiri et al. | 257/588 |
| 6,049,119 A * | 4/2000 | Smith | 257/575 |
| 6,362,066 B1 * | 3/2002 | Ryum et al. | 438/364 |
| 6,404,038 B1 * | 6/2002 | Cartagena | 257/586 |
| 6,445,058 B1 * | 9/2002 | Thiel et al. | 257/565 |
| 6,635,545 B2 * | 10/2003 | Böck et al. | 438/348 |

(Continued)

FOREIGN PATENT DOCUMENTS

DE    199 58 062 C2    6/2002

(Continued)

OTHER PUBLICATIONS

International Search Report from corresponding International Application No. PCT/EP2004/050978.

(Continued)

*Primary Examiner*—Quoc D Hoang
(74) *Attorney, Agent, or Firm*—Brinks Hofer Gilson & Lione

(57) ABSTRACT

An integrated circuit arrangement and fabrication method is provided. The integrated circuit arrangement contains an NPN transistor and a PNP transistor. The PNP transistor contains an emitter connection region and a cutout. The cutout delimits the width of the emitter connection region. The electrically conductive material of the connection region laterally overlaps the cutout.

11 Claims, 5 Drawing Sheets

U.S. PATENT DOCUMENTS

| | | | |
|---|---|---|---|
| 6,657,242 B1* | 12/2003 | Norstrom et al. ............. | 257/197 |
| 7,038,255 B2* | 5/2006 | Bottner et al. .............. | 257/197 |
| 2001/0013635 A1* | 8/2001 | Kitahata ..................... | 257/565 |
| 2001/0017399 A1* | 8/2001 | Oda et al. ................... | 257/565 |
| 2003/0027409 A1* | 2/2003 | Ramdani et al. ............ | 438/481 |
| 2004/0065942 A1* | 4/2004 | Trogolo et al. .............. | 257/565 |
| 2005/0014341 A1* | 1/2005 | El-Kareh et al. ............ | 438/322 |

FOREIGN PATENT DOCUMENTS

| | | | |
|---|---|---|---|
| EP | 0 651 443 A1 | 11/1993 | |
| EP | 1 220 321 A1 | 7/2002 | |
| JP | 04022167 | 1/1992 | |
| JP | 09232439 | 9/1997 | |
| JP | 10321730 | 12/1998 | |

OTHER PUBLICATIONS

International Examination Report from corresponding International Application No. PCT/EP2004/050978.

* cited by examiner

US 7,592,648 B2

INTEGRATED CIRCUIT ARRANGEMENT WITH NPN AND PNP BIPOLAR TRANSISTORS AND CORRESPONDING PRODUCTION METHOD

PRIORITY CLAIM

This application is a continuation of international application PCT/EP2004/050978, filed on Jun. 1, 2004, which claims the benefit of priority to German Application DE 103 27 709.9 filed on Jun. 21, 2003, both of which are incorporated by reference in their entirety.

TECHNICAL FIELD

The present embodiments relate to an integrated circuit arrangement and fabrication method. More particularly, the embodiments relate to an integrated circuit arrangement containing at least one NPN bipolar transistor and one PNP bipolar transistor and an associated fabrication method.

BACKGROUND

The vast majority of electronic devices employ integrated circuits which contain either or both NPN or PNP bipolar transistors. However, many integrated circuit arrangements are difficult to fabricate, using multiple exacting process steps that are costly in terms of processing material usage and time. Furthermore, often these processes are not optimized for fabrication of either the NPN or PNP transistors.

As the fabrication processes are not optimized, the electrical properties of the NPN bipolar transistor and of the PNP bipolar transistor are similarly not optimized. Thus, by way of example, during the patterning of a polycrystalline silicon layer arranged on an insulating layer in the region of the NPN transistor, it is difficult to effect a high degree of overetching to obtain steep sidewalls, which may be useful for the reproducibility of the transistor properties. More specifically, when etching a 200 nm thick polycrystalline layer, a high degree of overetching such as 100% overetching means a doubling of the etching duration used for etching the 200 nm.

However, the polycrystalline silicon layer is also used as a base connection region of the PNP transistor arranged alongside the emitter. During overetching of the polycrystalline silicon layer, the base connection region of the PNP transistor may be partly removed. This is problematic as the polycrystalline silicon layer is used simultaneously for the construction of the PNP and NPN transistors and is intended to be maintained in the PNP transistor.

FIG. 1 shows the fabrication of an integrated circuit arrangement 8 in accordance with the prior art. The integrated circuit arrangement 8 contains a p-doped substrate (not illustrated) made of silicon. An n-type epitaxial layer 10 is situated on the substrate. The epitaxial layer has been n-doped at its surface in the region of the PNP transistor. The dopant concentration in the doping region 12 is, for example, $10^{18}$ dopant atoms per cubic centimeter, so that the doping region 12 is suitable for forming a base region of the PNP transistor. Situated below the doping region 12 is a doping region 14, in which a p-type doping of, for example, $10^{17}$ doping atoms per cubic centimeter has been produced.

In the region of the NPN transistor, a doping region 16 is situated at the surface of the n-type epitaxial layer 10. The doping region 16 is n-doped and has, in this production stage, for example the basic doping of the n-type epitaxy of $10^{16}$ doping atoms per cubic centimeter. The doping region 16 is doped even more highly later as the collector region of the NPN transistor.

An insulating layer 18 is situated on the n-type epitaxial layer 10. The insulating layer 18, for example, has a thickness of 100 nm and comprises silicon dioxide. The insulating layer 18 has a large-area cutout in the region of the PNP transistor, and so it is not illustrated in FIG. 1. By contrast, the insulating layer 18 is present and still unpatterned in the region of the NPN transistor, in particular above the doping region 16.

After the application of the insulating layer 18, a heavily p-doped polycrystalline silicon layer 20 is deposited over the whole area. By way of example, the number of doping atoms in the polysilicon layer 20 is $10^{20}$ doping atoms per cubic centimeter. In the region of the PNP transistor, the polysilicon layer 20 contacts the doping region 12 as the insulating layer 18 is absent in this region. In the region of the NPN transistor, by contrast, the polysilicon layer 20 contacts the insulating layer 18.

An insulating covering layer 22 is applied above the entire polysilicon layer 20. Afterward, photoresist 24 is applied to the covering layer 22, exposed and developed, with the result that the regions of the photoresist 24 which are illustrated in FIG. 1 have remained, that is to say above an emitter connection region of the PNP transistor and above a base connection region of the NPN transistor.

Etching is subsequently carried out to pattern the covering layer 22 and to pattern the underlying polysilicon layer 20, for example with the aid of reactive ion etching, see arrows 26 and 28. The reactive ion etching is carried out during the etching of the polysilicon layer 20 selectively with respect to the insulating layer 18. In order to completely eliminate oblique sidewalls 30 of the polysilicon layer 20 in the region of the NPN transistor, a high degree of overetching is used. The doping region 12 is severed in the region of the PNP transistor on account of the high degree of overetching during the etching of the polysilicon layer 20. Therefore, only a weak degree of overetching is effected, the doping region 12 being incipiently etched and its original thickness D1 thus being reduced by a thickness D2. What is more, the selectivity in the region of the PNP transistor during the etching of the polysilicon layer 20 is considerably lower, on account of the silicon lying below the polysilicon layer 20, than the selectivity in the region of the NPN transistor, where the insulating layer 18 made of silicon dioxide lies below the polysilicon layer 20.

As a result the base connection region being thinned, the base connection resistance increases, which reduces the maximum oscillation frequency and increases the minimum noise figure and delay times of the integrated circuit. In addition, the reproducibility of the transistor quantities is reduced.

BRIEF DESCRIPTION OF THE DRAWINGS

The present invention is illustrated by way of example and not limited to the accompanying figures in which like references indicate similar elements. Exemplary embodiments will be explained in the following text with reference to the attached drawings, in which.

DETAILED DESCRIPTION

Figure 1:
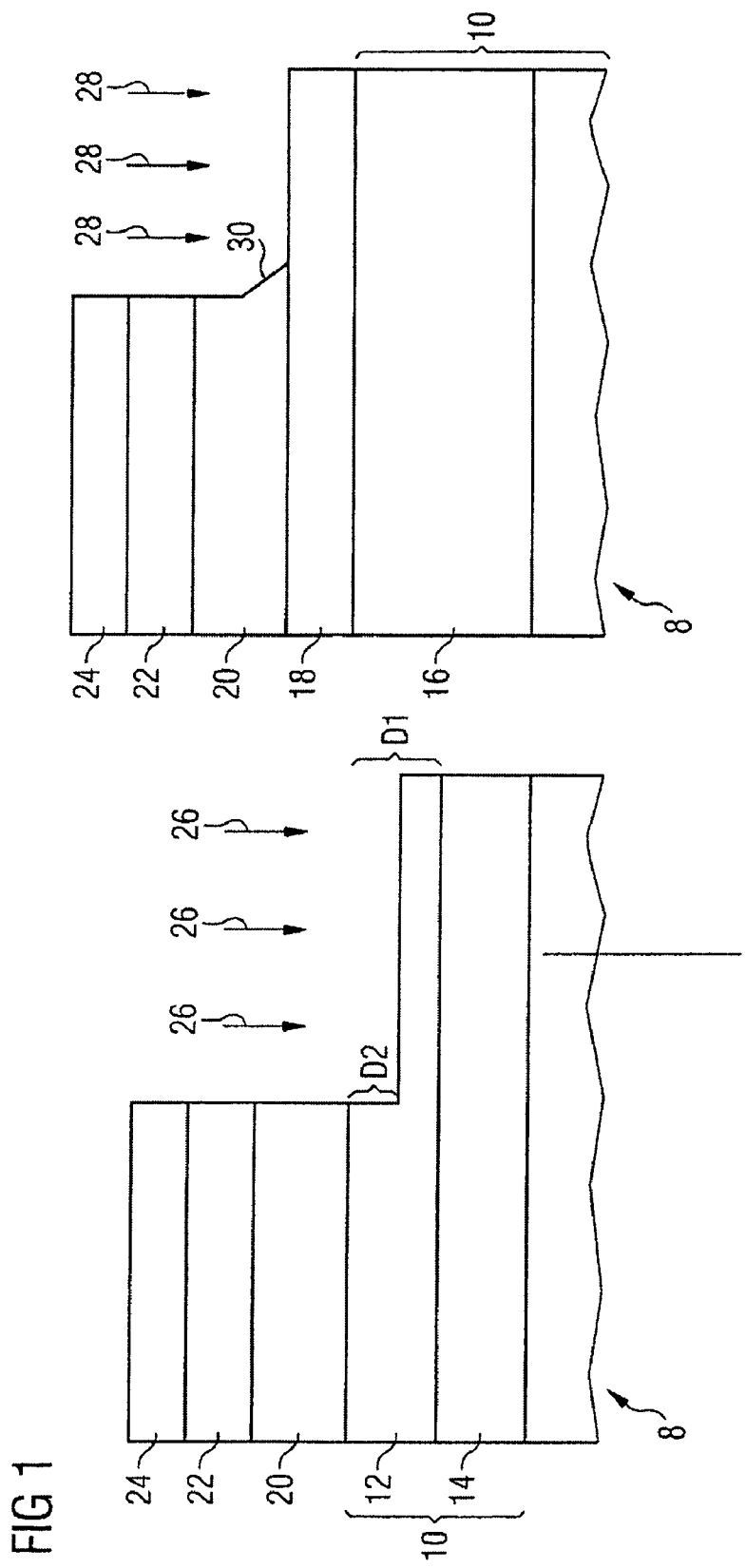
FIG. 1 shows etching of a base connection region of a PNP transistor during simultaneous overetching in the region of an NPN transistor in a conventional arrangement.

Skilled artisans appreciate that elements in the figures are illustrated for simplicity and clarity and have not necessarily been drawn to scale.

An integrated circuit arrangement contains NPN and PNP bipolar transistors and an insulating layer effecting electrical insulation, which contains a cutout in the region of the PNP bipolar transistor. The base region of the PNP bipolar transistor is arranged below the cutout in the region of the PNP transistor. Arranged in the cutout is electrically conductive material, which is electrically conductively connected to the emitter region of the PNP transistor or which even adjoins one emitter region. Another cutout is situated in the electrically insulating layer in the region of the NPN transistor, the base region of the NPN transistor being arranged in this cutout.

The insulating layer is brought over to the emitter region or to the emitter connection region of the PNP transistor, with the result that the cutout adjoins the connection region of the emitter of the PNP transistor and, consequently, prescribes the width of the electrical contact between emitter and emitter connection region and indirectly also the width of the emitter region. Moreover, the electrically conductive material is patterned such that, after the patterning, electrically conductive material of the connection region also adjoins the insulating layer outside the cutout. As a result of this, the insulating layer serves as an etching stop layer, rather than the sensitive partial region of the base connection region that is situated alongside the emitter region. On account of the unthinned base connection region, the base connection resistance remains small. As a result, the maximum oscillation frequency becomes large. The minimum noise figure and also delay times decrease. In addition, the reproducibility of the abovementioned characteristic quantities is improved.

The cutout in the region of the PNP transistor may also adjoin the emitter region. This is achieved in that after the introduction of the electrically conductive material, dopants from this material indiffuse into the material lying below the cutout and form the emitter region there.

The electrically conductive material may completely fill the cutout, so that no other material and no voids either are present in the cutout. The electrically insulating layer may be a planar layer arranged on a planar substrate. The planar substrate contains, for example, a substrate main region and an epitaxial layer of uniform thickness arranged thereon.

The cutout of the NPN transistor may have a monocrystalline layer containing a different basic material than the edge region of the NPN transistor that is not arranged in the cutout. The monocrystalline layer preferably contains silicon-germanium or silicon-germanium-carbon as basic material. The monocrystalline material that is not arranged in the cutout of the NPN transistor preferably contains silicon as basic material. The use of the materials mentioned makes it possible to achieve transition frequencies of 100 GHz or even of 200 GHz. Despite these high transition frequencies of the NPN transistor, the PNP transistor is not impaired excessively on account of the construction of the integrated circuit arrangement.

The electrically conductive material may be heavily p-doped semiconductor material, in particular polycrystalline semiconductor material, e.g. polycrystalline silicon. This material affords the possibility of producing the emitter region of the PNP bipolar transistor by outdiffusion into monocrystalline material. At the same time, connection regions for the connection of the base region of the NPN transistor are provided with a higher doping by outdiffusion. Consequently, method steps are once again used both for producing the PNP transistor and for producing the NPN transistor. Furthermore, the electrically conductive material with doping can be used to connect the collector region of the PNP transistor. This further simplifies the production.

Spacer elements (spacers) may be situated at side areas of the electrically conductive material and in a manner adjoining the insulating layer. The bottom region of the spacers lies on the insulating layer at the PNP transistor. The spacers are preferably produced from electrically insulating material, for example from silicon dioxide or silicon nitride. Moreover, the spacers may taper with increasing distance from the insulating material. The spacer elements are, for example, single spacer elements or double spacer elements, for the production of which only one layer has been etched isotropically or for the production of which two layers have been used, one of which has been etched isotropically. The spacer elements have an insulation function between the connection regions for the emitter and for the base only in the region of the NPN transistor. The spacer elements are not in the region of the PNP transistor, however, so that, without additional method steps, they are also formed in the region of the PNP transistor and left there.

The base region of the PNP transistor may be connected via a monocrystalline layer extending below the insulating layer as far as at least one base connection cutout in the insulating layer. The monocrystalline layer is doped more highly in the region of the base connection region than in the base region in order to reduce the connection resistance. The base connection region may extend to below a spacer element at the emitter connection region of the PNP transistor or even to below the emitter connection region of the NPN transistor. The base connection cutout additionally contains electrically conductive material, in particular highly doped polycrystalline silicon or metallic material. The base region of the PNP transistor, the collector region of the NPN transistor and also the emitter region of the NPN transistor may be connected via an n-doped semiconductor material layer. This layer is thus again used multiply and, through single patterning, connections are produced in transistors of both transistor types.

The edge region of the PNP transistor that is further away from the cutout may be formed using a doping zone having the same contour form as the cutout. In other words, this means that the cutout has been used as an implantation mask. The cutout thus has a further function. Such methods are also referred to as SIC methods (selectively implanted collector). The SIC method makes it possible to produce a small collector zone without an additional mask. On account of the small collector zone, the parasitic base-collector capacitance is considerably reduced in comparison with a wider collector. The electrical properties of the PNP transistor are improved further. This increases the incentive to use circuits containing both NPN and PNP transistors. By way of example, current sources at positive potential can be realized more simply with PNP transistors than with NPN transistors. An SIC method in the context of the simultaneous production of NPN and PNP transistors has been possible hitherto only in the region of the NPN transistor.

The PNP transistor may be formed as a multi-emitter transistor containing at least two cutouts adjoined, outside the respective cutout, by electrically conductive material of the connection region of an emitter. The width of the emitter can thus be reduced in comparison with previous PNP transistors in circuits with NPN transistors. A small emitter width brings about good RF properties of the transistor, but reduces the maximum permissible switching current. In order nevertheless to be able to switch larger currents, the arrangement of a plurality of emitter regions alongside one another also becomes attractive, the chip area required overall being small on account of the reduced emitter width. Multi-emitter PNP transistors with good radio frequency properties and high switchable current intensities can thus be produced on a small chip area.

The dopings contained in the circuit arrangement may be of the opposite type to the types specified above. Accordingly, by way of example, the base region of the PNP transistor would be arranged in a cutout situated in the insulating layer.

A method for producing an integrated circuit arrangement is also presented. The following steps are carried out: application of an insulating layer to a monocrystalline semiconductor material, e.g. to monocrystalline silicon; patterning of the insulating layer to produce a cutout in the region of the PNP transistor or of the PNP transistor that is still to be produced. The base region of the PNP transistor is situated or the base region will be formed below the cutout; application of a connection layer made of electrically conductive material or material that can be converted into such a material to the patterned insulating layer, that is to say in particular in-situ doping or subsequent doping of semiconductor material; patterning of the connection layer to produce a connection region for the emitter region of the PNP transistor in the cutout and on the insulating layer outside the cutout; production of the base region of the NPN transistor in the insulating layer after the patterning of the connection layer.

For the connection of the base region of the PNP transistor, connections made of metal which penetrate through the insulating layer may be used. Alternatively, n-doped connection regions which overlap the connection region for the emitter of the PNP transistor may be used. No additional chip area is required for the overlap since the emitter already overlaps the insulating layer by a predetermined distance.

Figure 2:
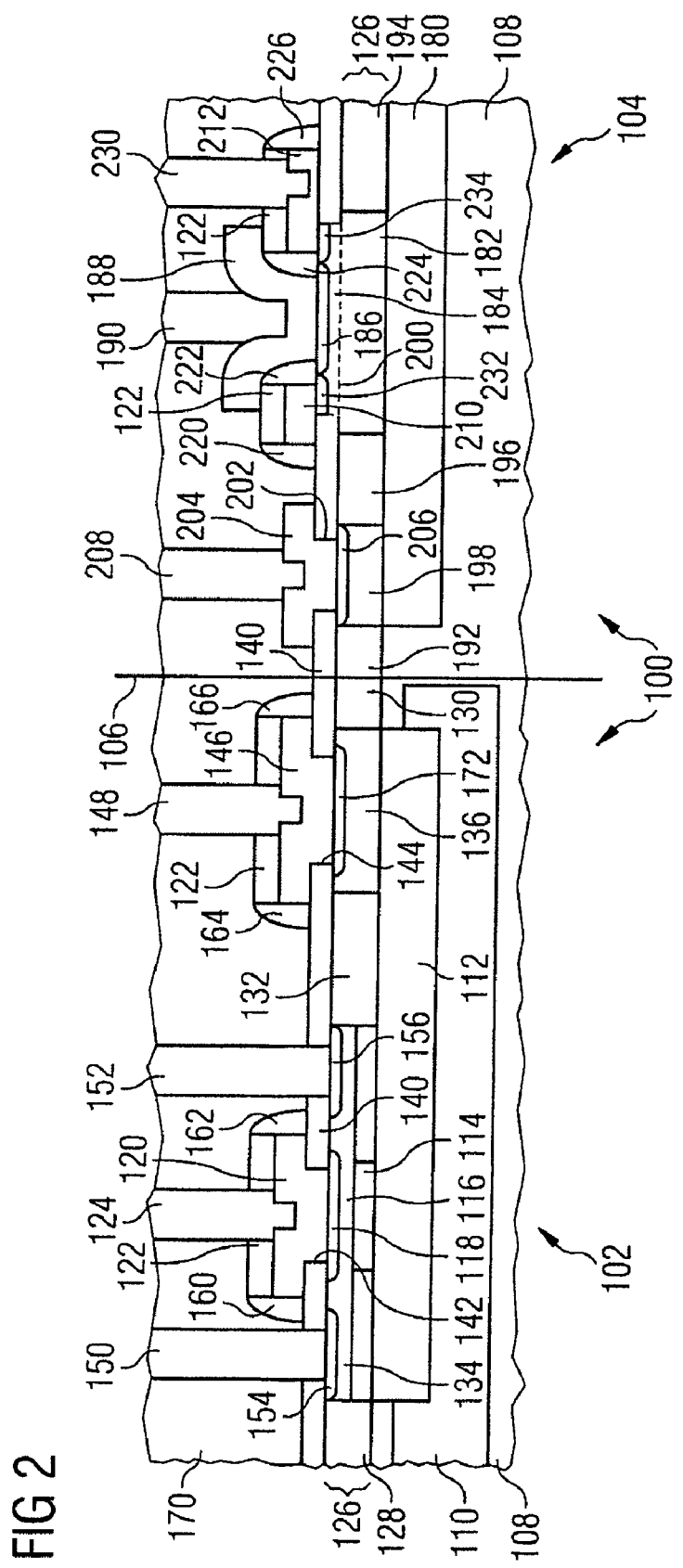
FIG. 2 shows an integrated circuit arrangement with a PNP transistor and an NPN transistor.

Turning specifically to the figures, FIG. 2 shows an integrated circuit arrangement 100. The integrated circuit arrangement contains a PNP transistor 102 illustrated in the left-hand part of FIG. 2 and an NPN transistor 104 illustrated in the right-hand part of FIG. 2. Both transistors 102 and 104 are vertical transistors in which the active emitter region, the base region and the active collector region are arranged vertically if a substrate surface that carries the transistor is situated horizontally. This is to say the active regions are lined up in a direction normal to a main area of the substrate, a main area being an area containing a considerably larger amount of area than, for example, an edge area of the substrate. In these transistors, the emitter regions are usually doped more highly than the collector regions. The dopant concentration of the base region usually lies between the dopant concentration of the emitter region and the dopant concentration of the collector region.

A vertical line 106 between the transistors 102 and 104 illustrates that the two transistors 102 and 104 may be arranged both alongside one another and in circuit parts of the integrated circuit arrangement 100 that are far away from one another. By way of example, a plurality of other components may lie between the two transistors 102 and 104.

Proceeding from a substrate 108, with increasing distance from the substrate 108, the transistor 102 contains an n-doped well 110, a p-doped buried collector lead layer 112, a monocrystalline p-doped collector region 114, a monocrystalline n-doped base region 116, a monocrystalline p-doped emitter region 118, a polycrystalline emitter connection region 120 made of silicon, and a metallic emitter connection 124, for example made of tungsten.

An insulating covering layer 122, for example made of silicon dioxide, with a cutout for the emitter connection is situated on the emitter connection region.

An epitaxial layer 126 applied on the substrate 102 contains two isolation trenches 128, 130, which laterally isolate the transistor 102, and also an isolation trench 132, which is arranged between isolation trenches 128 and 130 and serves to insulate an n-type doping region 134 for accommodating the base region 116 and for the connection of the base region 116 from a p-type doping region 136 for the connection of the buried p-type collector lead 112. In this embodiment, the isolating trenches 128 to 132 reach right into the collector lead 180. The epitaxial layer 126 has a thickness of 300 nm, for example. In another exemplary embodiment, the collector lead 112 of the PNP transistor 102 is arranged deeper in the substrate 108 than the collector lead 180 of the NPN transistor 104.

Situated on the isolating trenches 128 to 132 is an insulating layer 140, which for example has a thickness of 100 nm and comprises silicon oxide. The insulating layer 140 contains a cutout 142 for accommodating the polycrystalline emitter connection region 120 and a cutout 144 for accommodating a heavily p-doped polycrystalline collector connection region 146, which is likewise covered by the insulating covering layer 122. A metallic collector connection 148 leads to the collector connection region 146.

The insulating layer 140 additionally contains, on both sides of the cutout 142, cutouts for metallic base connections 150, 152, which are connected to the n-doped doping region 134 via heavily n-doped connection regions 154 and 156.

Moreover, spacers 160 to 164 are arranged laterally with respect to the emitter connection region 120 and the collector connection region 146. The spacers 160 to 164, the base connections 150, 152, the emitter connection 124 and the collector connection 128 lie in an intermediate-layer insulating layer 170 comprising silicon dioxide, for example. Further metallization layers for the connection of the transistor 102 are not illustrated in FIG. 2.

A heavily p-doped doping region 172 is also situated between the p-type doping region 136 and the collector connection region 146. The doping region 172 is produced by outdiffusion of dopants from the collector connection region 146 into the epitaxial layer 126.

Proceeding from the same substrate 108, with increasing distance from the substrate 108, the NPN transistor 104 contains an n-doped buried collector lead 180, a monocrystalline n-doped collector region 182, a monocrystalline p-doped base region 184, a monocrystalline n-doped emitter region 186, an n-doped polycrystalline emitter connection region 188, and a metallic emitter connection 190.

The transistor 104 contains two isolation trenches 192 and 194 reaching as far as the collector lead 180. An isolation trench 196 is arranged between the isolation trenches 192 and 194 and insulates the collector region 182 from an n-doped doping region 198. The doping region 198 serves for the connection of the buried collector lead 180.

The insulating layer 140 is also arranged on the isolating trenches 192 to 196. In the region of the NPN transistor 104, the insulating layer 140 has a cutout 200, in which is arranged a layer which is grown by selective epitaxy and usually comprises in part silicon-germanium and in part silicon. By way of example, the silicon-germanium layer is produced first and then the silicon layer. The cutout 200 and thus the epitaxial layer contains the base region 184 and the emitter region 186.

In the insulating layer 140, a cutout 202 is additionally situated in the region of the NPN transistor 104, a heavily doped polycrystalline collector connection region 204 being arranged in the cutout 202. The collector connection region 204 comprises n-doped polycrystalline silicon, the dopants of which have partly been indiffused into the epitaxial layer 126 and form a doping region 206 there. The doping region 206 adjoins the doping region 198. The collector connection region 204 is connected via a metallic collector contact 208.

Moreover, two p-doped polycrystalline regions 210 and 212 made of polycrystalline silicon are arranged to overlap the edge of the cutout 200 on the insulating layer 140 in the region of the NPN transistor 104. The polycrystalline regions 210 and 212 are covered by residual regions of the covering layer 122. The polycrystalline region 212 is connected via a metallic base connection 230.

Spacers 220 to 226 are arranged at the side areas of the polycrystalline regions 210, 212 and the regions of the covering layer 122 on the polycrystalline regions. At the two side areas facing one another, the spacers 222 and 224 adjoin the polycrystalline emitter connection region 188.

From the doped polycrystalline regions 210 and 212, dopants have penetrated into the silicon-germanium region arranged within the cutout 200, where they form doping regions 232 and 234. The transistors 102 and 104 are, for example, radially symmetrical transistors or transistors whose layers continue rearward or forward perpendicularly to the plane of the page.

Figure 3:
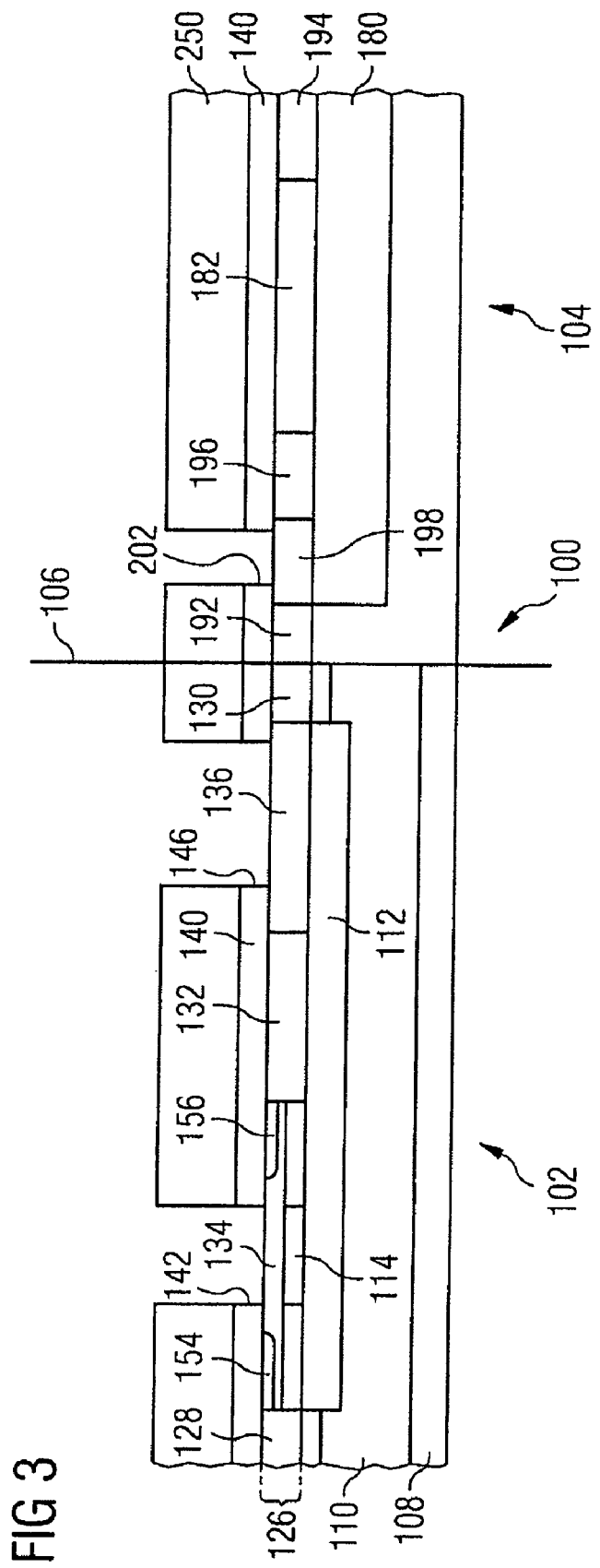
FIGS. 3 and 4 show production stages in the production of the circuit arrangement shown in FIG. 2.

FIG. 3 shows a production stage of the integrated circuit arrangement 100. Proceeding from the p-doped substrate 108, firstly the n-doped buried collector lead 180 is produced in the region of the NPN transistor 104 by means of e.g. arsenic implantation and subsequent indiffusion. The n-type well 110 is implanted in the region of the PNP transistor, the well 110 serving to insulate the transistor 102 from the substrate 108.

The epitaxial layer 126 is then applied by means of whole-area epitaxy. As an alternative, the epitaxy may also be dispensed with if the regions 110 and 180 are implanted with higher energy. The isolating trenches 128 to 132 and 192 to 196 are formed in the epitaxial layer 126 using a photolithographic process, for example using a reactive ion etching. The isolating trenches 128 to 132 and 192 to 196 are then filled with silicon dioxide, which is subsequently planarized. As an alternative, instead of the isolating trenches 128 to 132 and 192 to 196, it is also possible to use a LOCOS technique (LOCal Oxidization of Silicon). The collector region 182 is defined during the production of the isolation trenches 194 and 196.

The doping region 198 is doped in a subsequent implantation step using a photomask (not illustrated). For example, using implantation and subsequent diffusion. The implantation is also referred to as NPN collector deep implantation.

Afterward, the buried collector lead 112, the n-type doping region 134 and the connection regions 154 and 156 are implanted using additional masks. Furthermore, an additional mask is used to produce the p-type doping region 136 serving for the connection of the collector region 114 of the PNP transistor.

After carrying out these implantation steps, the insulating layer 140 is applied. A photoresist layer 250 is applied to the insulating layer 140. The photoresist layer 250 is selectively exposed and developed in order to define the position of the cutouts 142, 146 and 202. Afterward, the cutouts 142, 146 and 202 are etched into the insulating layer 140, for example using reactive ion etching or wet-chemical etching.

The collector region 114 arranged below the cutout 142 can then be implanted without using an additional mask. As an alternative, however, an additional mask can also be used for the implantation of the collector region 114, or the implantation of the collector region may be effected earlier in the process sequence, e.g. it is possible to concomitantly use the photolithographic technology for the implantation of the region 134.

Figure 4:
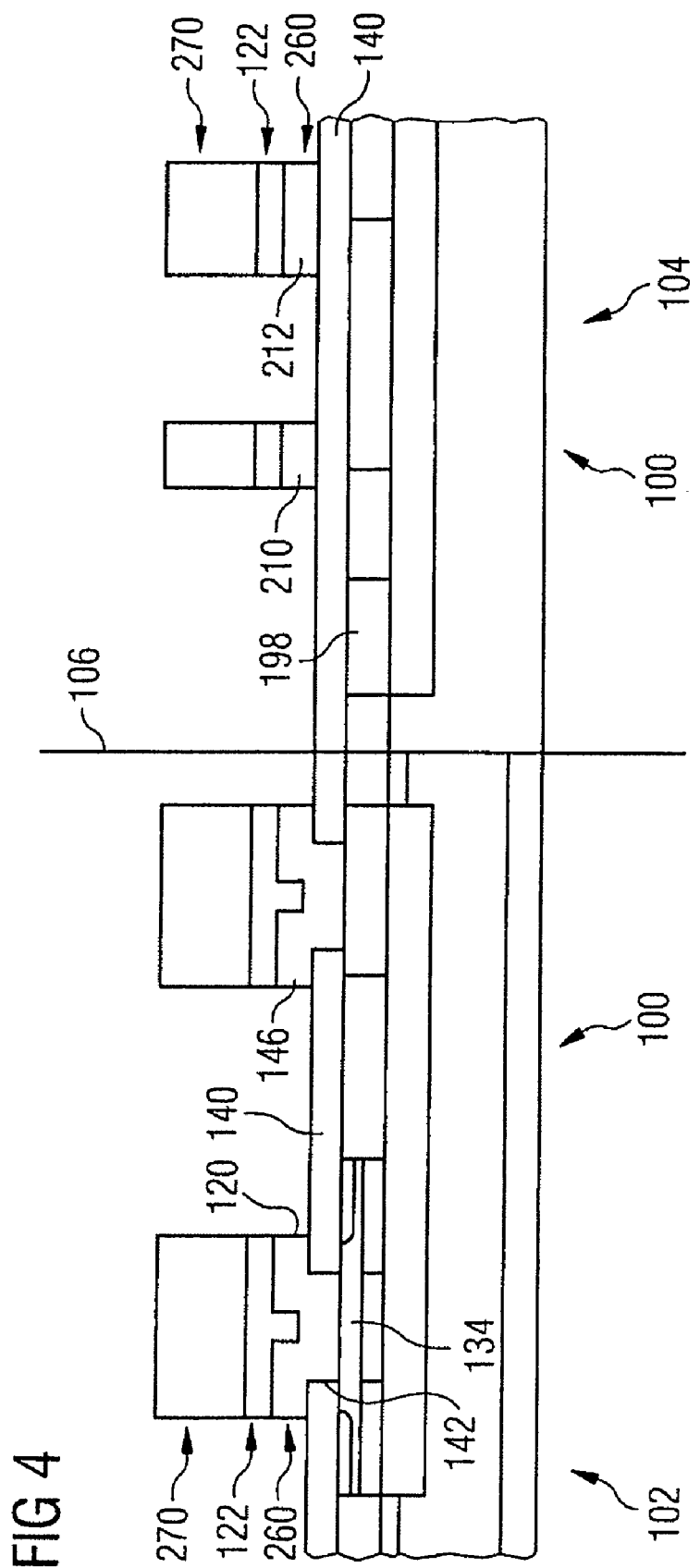

As illustrated in FIG. 4, the residue of the photoresist layer 250 is subsequently removed. A p-doped polycrystalline silicon layer 260 is deposited or produced by undoped deposition and subsequent doping. The covering layer 122 is applied to the silicon layer 260, for example, using a deposition process. Afterward, a photoresist layer 270 is applied and selectively exposed. The exposed photoresist layer 270 is developed in order to define the boundaries of the polycrystalline emitter connection region 120, of the polycrystalline collector connection region 146, of the polycrystalline region 210 and of the polycrystalline region 212. The covering layer 122 and the polycrystalline silicon layer 260 are subsequently patterned using the patterned photoresist layer 270, the emitter connection region 120, the collector connection region 146, the polycrystalline region 210 and the polycrystalline region 212 being produced from the polycrystalline layer 260. By way of example, reactive ion etching is used. The insulating layer 140 serves as an etching stop layer for all four regions mentioned. Therefore, even a long overetching does not attack the n-type doping region 134. In the NPN transistor 104, the incipient etching of the n-type doping region 198 is noncritical.

As can be seen from FIG. 2 again, the NPN transistor 104 is subsequently completed, but with no further permanent layers being applied in the region of the vertical PNP transistor 102. In the region of the NPN transistor 104, the following are produced in the following order: the cutout 200 by wet-chemical etching of the insulating layer 140; the epitaxial layer 184; the spacers 220 to 226 and 160 to 166; the collector connection region 204 and the emitter connection region 188 from an n-doped polycrystalline silicon layer using photolithography.

A heat treatment is subsequently effected for diffusion of the dopants on the polycrystalline silicon. The emitter region 118, the doping region 172, the doping region 206, the doping regions 232, 234 and the emitter region 186 are produced during this process.

The intermediate-layer insulating layer 170 is subsequently applied, planarized and patterned using photolithography. The metallic contacts are introduced into the contact holes produced. Further metallization layers are subsequently produced.

Figure 5:
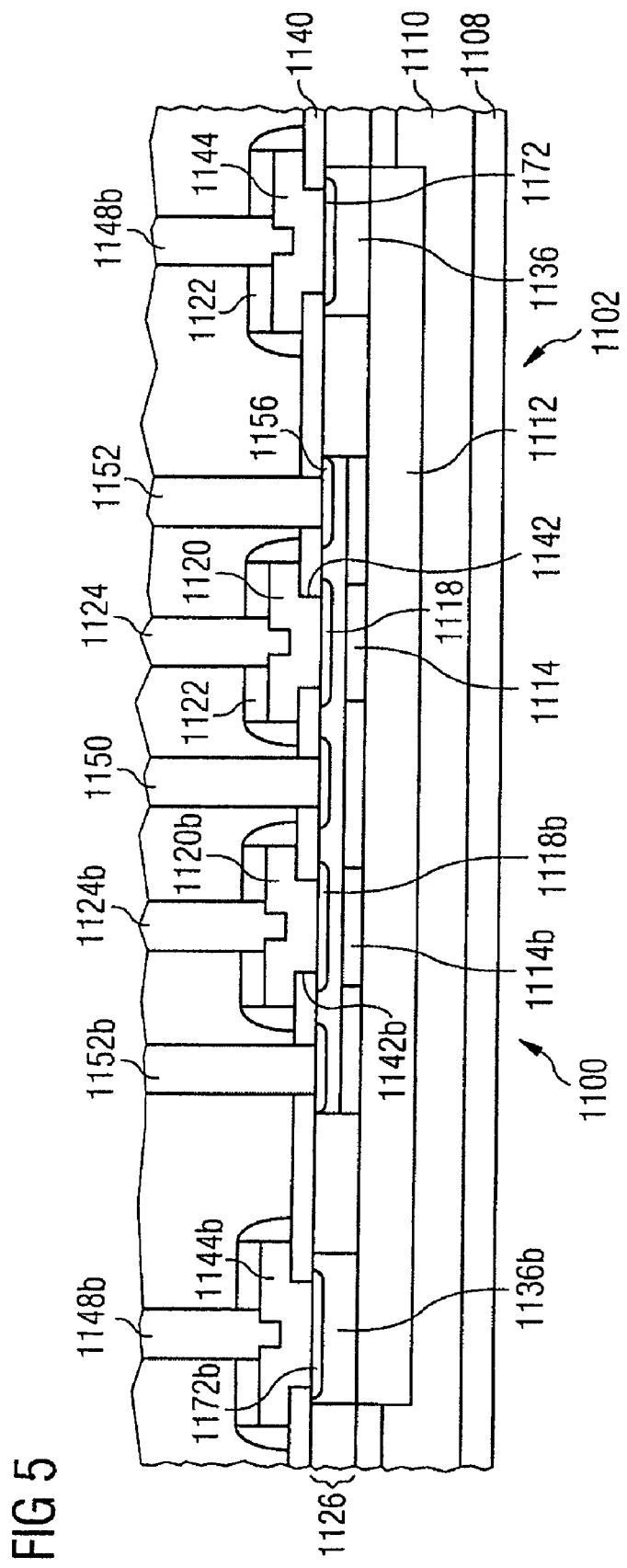
FIG. 5 shows an integrated circuit arrangement with a multi-emitter PNP transistor and with an NPN transistor.

FIG. 5 shows an integrated circuit arrangement 1100, during the production of which the same method steps have been carried out as during the production of the circuit arrangement 100. However, a PNP transistor 1102—corresponding to the PNP transistor 102—with two emitter regions 1118 and 1118b separate from one another has been implemented. Furthermore, the transistor 1102 contains two collector connection regions 1144 and 1144b.

In FIG. 5, elements which have already been explained above are identified by the same reference symbols but preceded by a "1" in each case. These elements will not be explained again. Doubly embodied elements having the same construction as the elements already explained with reference to FIGS. 2 to 4 have the same reference symbol in FIG. 5, but preceded by a "1" and followed by the lower case letter "b", e.g. the second emitter connection region 1120b in addition to the emitter connection 1120. The central base connection 1150 shown in FIG. 5 is optional. Moreover, it is also possible to implement the variant with a collector connection on both sides as explained above with reference to FIGS. 2 to 4.

In another exemplary embodiment, field effect transistors are also integrated in the integrated circuit arrangement 100 to 1100 in addition to the two types of bipolar transistor, thereby producing e.g. a BiCMOS (Bipolar Complementary Metal Oxide Semiconductor) circuit arrangement.

In contrast to methods used hitherto, in the case of the methods in accordance with the exemplary embodiments explained, an n-doped polycrystalline silicon which runs partly above the p-type polycrystalline silicon may or may not be used for the base connection. Even if polycrystalline silicon is used for the base connection, there is an overlap of the polycrystalline silicon with the emitter connection region over a chip area region already occupied by the overlap of the emitter connection region 120 over the insulating layer 140. The overlap of the emitter region over the insulating layer does not impair the effective width of the emitter region 118, so that the emitter can be chosen to be significantly narrower than hitherto. The electrical properties of the PNP transistor can be considerably improved as a result. The multi-emitter configuration in accordance with FIG. 5, which can be used e.g. for a high current-carrying capacity per chip area, also becomes more attractive as a result.

To summarize, the integration of a vertical PNP transistor into a technology with NPN transistors is provided. In these arrangements, the emitter of the vertical PNP transistor is defined by an opening, namely the cutout 142, in an insulating layer 140 that is already used. The process steps for producing the opening in the insulating layer 140 also are implemented for producing openings for substrate contact-connection.

The production of a vertical PNP transistor with additional insertion of the insulating layer 140 and an additional etching for the cutout 142 is likewise possible if PNP transistors are intended to be produced without the simultaneous production of NPN transistors.

It is therefore intended that the foregoing detailed description be regarded as illustrative rather than limiting, and that it be understood that it is the following claims, including all equivalents, that are intended to define the spirit and scope of this invention. For example, siliciding may be carried out on the NPN and/or PNP transistors. Nor is anything in the foregoing description intended to disavow scope of the invention as claimed or any equivalents thereof.

We claim:

1. An integrated circuit arrangement comprising:
   a NPN transistor containing an n-doped emitter region, a p-doped base region and an n-doped collector region;
   a PNP transistor containing a p-doped emitter region, an n-doped base region and a p-doped collector region; and
   an insulating layer on semiconductor material, the insulating layer having a first cutout defining a space, the base region of the PNP transistor being arranged below the space defined by the first cutout;
   electrically conductive material of an emitter connection region of the PNP transistor is arranged in the space defined by the cutout;
   the electrically conductive material connected to the emitter region of the PNP transistor;
   the first cutout at least one of (1) delimiting the width of the electrical contact between the emitter connection region and the emitter region of the PNP transistor or (2) adjoining the emitter connection region;
   the electrically conductive material at least one of (1) overlapping the insulating layer or (2) adjoining the insulating layer outside the first cutout; and
   a second cutout defining a second space, and being formed within the insulating layer, the base region of the NPN transistor being located substantially within the second space defined by the second cutout.

2. The circuit arrangement of claim 1, wherein at least one of:
   the first cutout adjoins the emitter region of the PNP transistor,
   the electrically conductive material of the emitter connection region completely fills the first cutout,
   the insulating layer is a planar layer,
   the emitter region of the PNP transistor is arranged below the first cutout, or
   the emitter region of the NPN transistor is arranged in the second cutout.

3. The circuit arrangement of claim 1, wherein a monocrystalline layer is disposed in the second cutout, the monocrystalline layer comprising a different material than the collector region of the NPN transistor that is not arranged in the second cutout.

4. The circuit arrangement of claim 1, wherein spacer elements are arranged at the electrically conductive material of the emitter connection region so as to adjoin the insulating layer, the spacer elements comprising electrically insulating material and tapering with increasing distance from the insulating layer.

5. The circuit arrangement of claim 1, wherein the base region of the PNP transistor is connected via a monocrystalline layer extending below the insulating layer to at least one base connection cutout in the insulating layer, the monocrystalline layer is doped more highly in the region of the base connection cutout than in the base region, and the base connection cutout comprises electrically conductive material.

6. The circuit arrangement of claim 1, wherein the PNP transistor is a multi-emitter transistor containing at least two cutouts which are overlapped by electrically conductive material of an emitter connection region outside the respective cutout.

7. An integrated circuit arrangement comprising:
   a NPN transistor containing an n-doped emitter region, a p-doped base region and an n-doped collector region;
   a PNP transistor containing a p-doped emitter region, an n-doped base region and a p-doped collector region; and
   an insulating layer on semiconductor material, the insulating layer having a first cutout defining a first space, the base region of the PNP transistor being arranged below the first space defined by the cutout;
   electrically conductive material of an emitter connection region of the PNP transistor is substantially arranged in the first space defined by the cutout; and
   the electrically conductive material connected to the emitter region of the PNP transistor;
   the first cutout at least one of (1) delimiting the width of the electrical contact between the emitter connection region and the emitter region of the PNP transistor or adjoining the emitter connection region, (2) the electrically conductive material at least one of overlapping the insulating layer or (3) adjoining the insulating layer outside the first cutout; and
   a second cutout defining a second space and being formed with the insulating layer, the base region of the NPN transistor being located substantially within the second space defined by the second cutout;
   wherein at least one of (1) at least one of the collector or emitter region of the PNP transistor has the same contour form as the first cutout, or (2) at least one of the collector or emitter region of the NPN transistor has the same contour form as the second cutout.

8. The circuit arrangement of claim 7, wherein at least one of:
- the first cutout adjoins the emitter region of the PNP transistor,
- the electrically conductive material of the emitter connection region completely fills the first cutout,
- the insulating layer is a planar layer,
- the emitter region of the PNP transistor is arranged below the first cutout, or
- the emitter region of the NPN transistor is arranged in the second cutout.

9. The circuit arrangement of claim 7, wherein a monocrystalline layer is disposed in the second cutout, the monocrystalline layer comprising a different material than the collector region of the NPN transistor that is not arranged in the second cutout.

10. The circuit arrangement of claim 7, wherein spacer elements are arranged at the electrically conductive material of the emitter connection region so as to adjoin the insulating layer, the spacer elements comprising electrically insulating material and tapering with increasing distance from the insulating layer.

11. The circuit arrangement of claim 7, wherein the base region of the PNP transistor is connected via a monocrystalline layer extending below the insulating layer to at least one base connection cutout in the insulating layer, the monocrystalline layer is doped more highly in the region of the base connection cutout than in the base region, and the base connection cutout comprises electrically conductive material.

* * * * *